(12) United States Patent
Riehl et al.

(10) Patent No.: US 10,326,314 B2
(45) Date of Patent: Jun. 18, 2019

(54) EFFICIENCY IMPROVEMENT FOR SOFT-SWITCHED WIRELESS POWER TRANSMITTERS

(71) Applicant: MediaTek Inc., Hsin-Chu (TW)

(72) Inventors: Patrick Stanley Riehl, Lynnfield, MA (US); Hasnain Akram, Burlington, MA (US); Philip Frank Tustin, North Andover, MA (US)

(73) Assignee: MediaTek Inc., Hsin-Chu (TW)

( * ) Notice: Subject to any disclaimer, the term of this patent is extended or adjusted under 35 U.S.C. 154(b) by 93 days.

(21) Appl. No.: 15/411,749

(22) Filed: Jan. 20, 2017

(65) Prior Publication Data

US 2017/0302110 A1 Oct. 19, 2017

Related U.S. Application Data

(60) Provisional application No. 62/321,780, filed on Apr. 13, 2016.

(51) Int. Cl.
| | |
|---|---|
| *H02J 50/12* | (2016.01) |
| *H03F 3/217* | (2006.01) |
| *H03F 3/24* | (2006.01) |
| *H02J 50/40* | (2016.01) |
| *H02J 50/60* | (2016.01) |
| *H02J 7/02* | (2016.01) |

(52) U.S. Cl.
CPC .............. *H02J 50/12* (2016.02); *H02J 7/025* (2013.01); *H02J 50/40* (2016.02); *H02J 50/60* (2016.02); *H03F 3/2176* (2013.01); *H03F 3/245* (2013.01)

(58) Field of Classification Search
CPC .. H02J 50/12; H02J 50/40; H02J 50/60; H02J 7/025; H03F 3/2176; H03F 3/245
USPC ........................................................ 307/104
See application file for complete search history.

(56) References Cited

U.S. PATENT DOCUMENTS

| | | | |
|---|---|---|---|
| 2010/0117454 | A1 | 5/2010 | Cook et al. |
| 2011/0148215 | A1 | 6/2011 | Marzetta et al. |
| 2013/0099807 | A1 | 4/2013 | Wheeland et al. |
| 2014/0103738 | A1 | 4/2014 | Campanella et al. |

FOREIGN PATENT DOCUMENTS

| | | |
|---|---|---|
| CN | 105226844 A | 1/2016 |
| WO | WO 2016-010362 | 1/2016 |

OTHER PUBLICATIONS

Extended European Search Report for Application No. 17165559.0, dated Aug. 7, 2017.

*Primary Examiner* — Hal Kaplan
(74) *Attorney, Agent, or Firm* — Wolf, Greenfield & Sacks, P.C.

(57) ABSTRACT

A wireless power transmitter includes an inverter in which a voltage varies in response to a resonant network and circuitry configured to (A) measure a characteristic indicative of a load seen by the wireless power transmitter, (B) determine a duty cycle of the inverter based upon the characteristic, and (C) switch the inverter with the determined duty cycle.

13 Claims, 5 Drawing Sheets

EFFICIENCY IMPROVEMENT FOR SOFT-SWITCHED WIRELESS POWER TRANSMITTERS

CROSS REFERENCE TO RELATED APPLICATION

This application claims the benefit of U.S. Provisional Application No. 62/321,780, filed Apr. 13, 2016, which is hereby incorporated by reference in its entirety.

BACKGROUND

1. Technical Field

The techniques described herein relate generally to class-E amplifiers, and in particular to wireless power transmission.

2. Discussion of the Related Art

Wireless Power Transfer Systems (WPTS) are gaining increasing popularity as a convenient way to deliver power without wires or connectors. WPTS currently under development in the industry can be separated in two major classes: magnetic induction (MI) systems and magnetic resonance (MR) systems. Both types of systems include a wireless power transmitter and a wireless power receiver. Such systems can be used to power or charge mobile devices such as smartphones or tablet computers, among other applications.

Some inductive WPTS typically operate in an allocated frequency range of several hundred kilohertz using frequency variation as a power flow control mechanism.

MR WPTS typically operate on a single resonant frequency using input voltage regulation to regulate output power. In typical applications, MR WPTS operate at a frequency of 6.78 MHz.

Industry committees have been working on developing international standards for consumer products based on wireless power transfer. Currently, due to the difference in operating frequency, WPTS systems of different types are not interoperable.

Class E amplifiers are switching-based amplifiers, which use the resonance of an LC network to perform soft switching to achieve higher efficiency. Class E amplifiers are most commonly found in radio frequency (RF) applications.

SUMMARY

Some embodiments relate to a method of operating an inverter of a wireless power transmitter in which a voltage of the inverter varies in response to a resonant network. The method includes (A) measuring a characteristic indicative of a load seen by the wireless power transmitter, (B) determining a duty cycle of the inverter based upon the characteristic, and (C) switching the inverter with the determined duty cycle.

The inverter may be a class E amplifier.

The characteristic indicative of the load may be an impedance or reactance.

The characteristic indicative of the load may be estimated based upon a magnitude of a signal measured by the wireless power transmitter.

The characteristic indicative of the load may be estimated based upon a measured magnitude of a voltage and a measured magnitude of a current.

(B) may comprise increasing the duty cycle when an imaginary component of the impedance decreases.

(B) may comprise decreasing the duty cycle when an imaginary component of the impedance increases.

Some embodiments relate to a non-transitory computer readable storage medium having stored thereon instructions, which, when executed by a processor, performs the method.

Some embodiments relate to a wireless power transmitter that includes an inverter in which a voltage varies in response to a resonant network and circuitry configured to (A) measure a characteristic indicative of a load seen by the wireless power transmitter, (B) determine a duty cycle of the inverter based upon the characteristic, and (C) switch the inverter with the determined duty cycle.

The circuitry may comprise a measurement circuit configured to perform at least a portion of (A), and a controller configured to perform at least a portion of (B).

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

In a WPTS the wireless power transmitter and wireless power receiver can be inductively coupled to one another. Due to the spacing between them, the coil geometry and/or placement, they may be loosely coupled to one another, i.e., the coupling coefficient may be relatively low. The load impedance seen by the wireless power transmitter may vary across a wide range as the spacing and/or placement of the wireless power receiver or the load seen by the wireless power receiver changes, due at least in part to changes in coupling. For example, the load impedance seen by the wireless power transmitter may vary if multiple receivers are placed near the transmitter, or if a foreign metal object is placed near the transmitter. If the wireless power transmitter has an inverter that employs LC resonance, such as a Class-E amplifier, for example, the variation in the load impedance seen by the wireless power transmitter can alter the tuning of the inverter. When the tuning is altered the timing of the current and/or voltage waveforms in the inverter can change. This can lead to reduced efficiency due to either hard switching or diode conduction, as will be explained with reference to FIGS. 1A-1C.

Figure 1A:
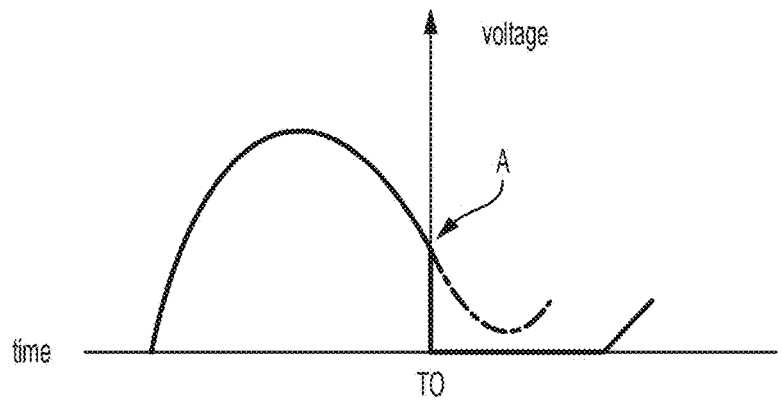
FIG. 1A shows a plot of voltage over time in the case of hard switching.
Figure 1B:
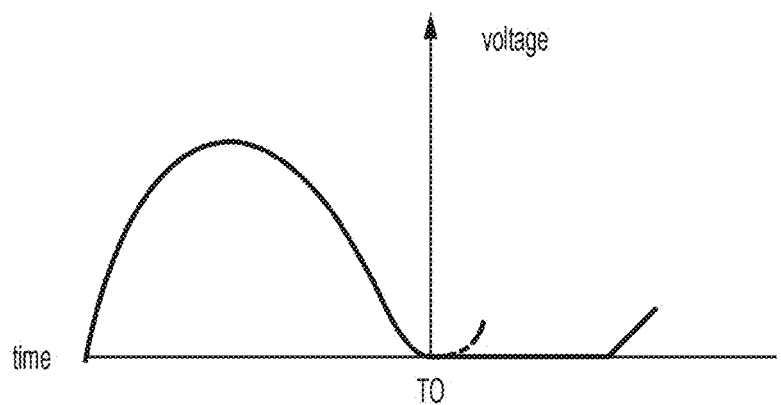
FIG. 1B shows a plot of voltage over time in the case of zero voltage switching.
Figure 1C:
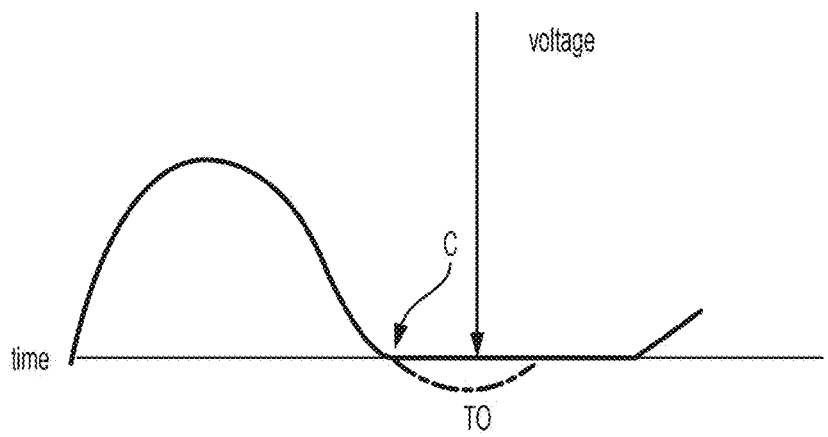
FIG. 1C shows a plot of voltage over time in the case of diode conduction.

Hard switching occurs when a transistor switches states before the voltage or current across it drops to zero, creating wasted power, as shown in FIG. 1A. At time T0, the transistor switches states while the voltage across it is still high, at level A. Soft switching is a possible way of reducing losses in power electronic switches. Soft switching can occur when the operation of a transistor is controlled to constrain the voltage or current to be zero or close to zero as the transistor switches states. It may be advantageous to perform zero voltage switching, one type of soft switching, by switching a transistor when the voltage across it is zero or close to zero, as shown in FIG. 1B. At time T0, the transistor switches states, and the voltage across the transistor is approximately zero, which reduces power losses when the transistor switches. However, if the voltage across the transistor drops to zero too early, as illustrated in FIG. 1C, diode conduction occurs, resulting in a diode voltage drop and reduced efficiency. At point C, the voltage across the transistor goes to zero, but the transistor does not switch states until time T0. Diode conduction through a body diode of the transistor occurs between point C and time T0, which reduces efficiency.

Accordingly, it may be desirable to operate the wireless power transmitter to achieve a timing as shown in FIG. 1B, to achieve zero voltage switching. However, when the load impedance seen by a wireless power transmitter varies, the tuning of the inverter may be altered. This changes the timing of the voltage waveform, resulting in reduced efficiency due to hard switching or diode conduction, as shown in FIG. 1A and FIG. 1C.

Some solutions exist to address the detuning problem in Class-E amplifiers, but rely on components external to the amplifier, such as a tunable loading capacitor, to change the effective value of the inductance or capacitance in the LC network of the inverter. Tuning schemes that change the effective value of the inductance or capacitance may require additional switches, capacitors or inductors to control the effective inductance or capacitance, which may be large, costly and/or degrade efficiency.

The techniques described herein can improve efficiency by adjusting the timing of switching the inverter as the impedance seen by the wireless power transmitter changes. Accordingly, switching waveforms closer to those desired for zero voltage switching can be produced. In some embodiments, such waveforms may be produced without tuning the effective inductance or capacitance of the inverter LC network. Prior to describing such techniques, an overview of a WPTS will be described with reference to FIG. 2.

Figure 2:
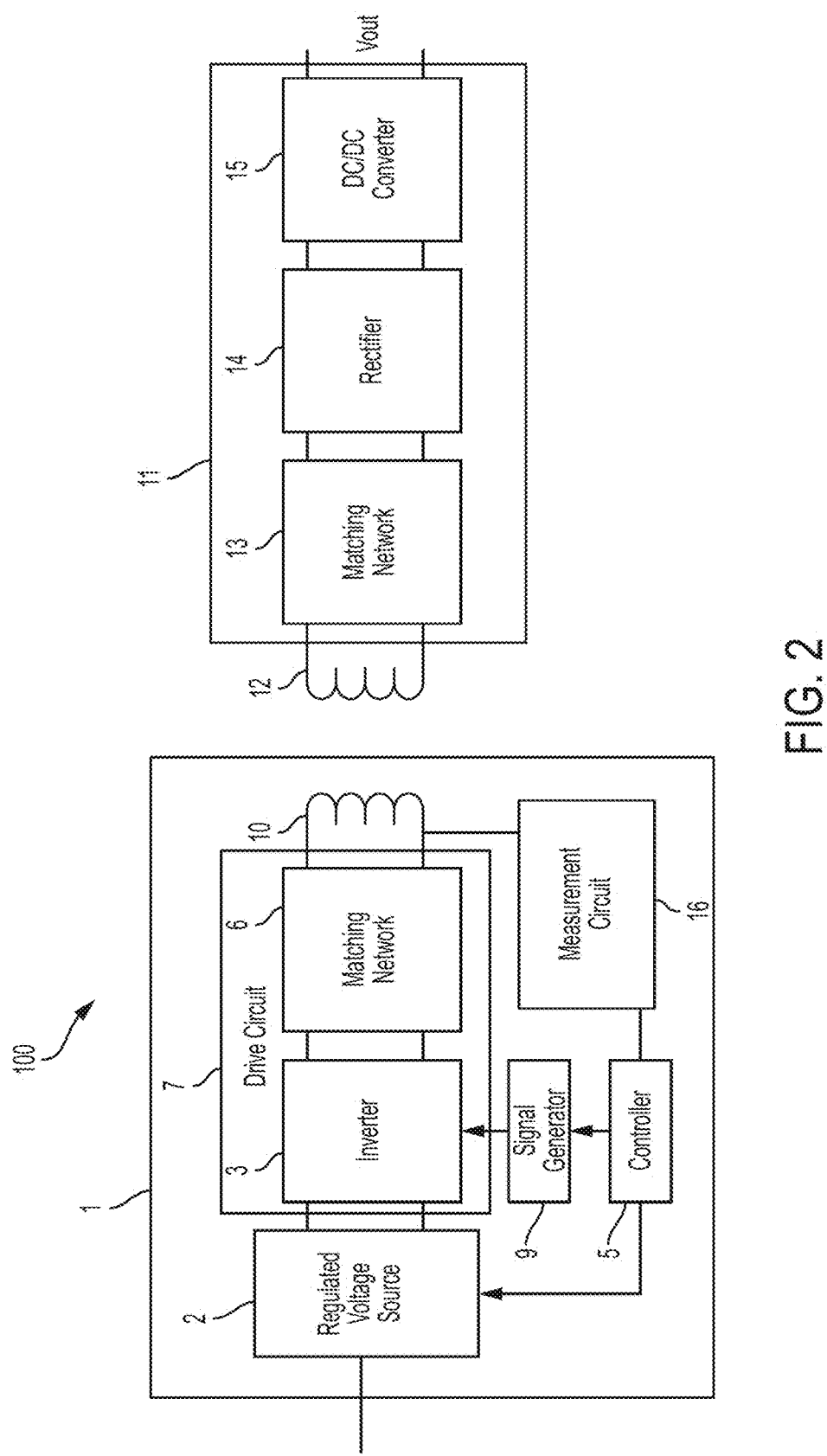
FIG. 2 shows one embodiment of a wireless power transmitter.

FIG. 2 shows a block diagram of a wireless power system 100 including a wireless power transmitter 1 and a wireless power receiver 11. The wireless power transmitter 1 has a drive circuit 7 including an inverter 3 that drives a transmit coil 10 through a matching network 6. The wireless power transmitter 1 may include a regulated voltage source 2 (e.g., a voltage regulator) that provides a regulated DC voltage to the inverter 3. The regulated voltage source 2 produces a regulated DC output voltage in response to control stimulus from the controller 5. In some embodiments, the drive circuit 7 may be a soft-switched power converter, such as a class E amplifier that converts the DC voltage at the input of inverter 3 into an AC output voltage to drive the transmit coil 10. Producing an AC output voltage enables wireless power transmission through electromagnetic induction. The controller 5 may control a signal generator 9 to drive the inverter 3 with signals of a selected wireless power transmission frequency. As an example, the inverter 3 may be switched at a frequency between 100 and 205 kHz to transmit power to a wireless power receiver designed to receive wireless power according to the Qi specification for low power Qi receivers and 80-300 kHz for medium power Qi receivers. The inverter 3 may be switched at a higher frequency, such as a frequency of greater than 1 MHz, within an ISM band, e.g., 6.765 MHz to 6.795 MHz, to transmit power to a receiver designed to receive wireless power using MR technology. However, these frequencies are described merely by way of example, as wireless power may be transmitted at a variety of suitable frequencies, in accordance with any suitable specification. Controller 5 may be an analog circuit, a digital circuit or a combination thereof. Controller 5 may be programmable, and may command signal generator 9 to produce signals at a desired transmission frequency based on stored program instructions, so that inverter 3 switches at the desired transmission frequency. Matching network 6 may facilitate wireless power delivery by presenting a suitable impedance to the inverter 3. The matching network(s) may have one or more capacitive or inductive elements or any suitable combination of capacitive and inductive elements. Since the transmit coil 10 may have an inductive impedance, in some embodiments the matching network 6 may include one or more capacitive elements, which, when combined with the impedance(s) of the transmit coil 10, presents an impedance to the output of inverter 3 suitable for driving the transmit coil 10. In some embodiments, during wireless power transfer the resonant frequency of the matching network 6 may be equal to or approximately equal to the switching frequency of the inverter 3. The transmit coil 10 may be realized by any suitable type of conductors. The conductors may be wires, including solid wire or Litz wire, or patterned conductors, such as patterned conductors of a PC board or an integrated circuit.

The AC current in the transmit coil 10 generates an oscillating magnetic field in accordance with Ampere's law. The oscillating magnetic field induces an AC voltage into a receiver coil 12 of the wireless power receiver 11 in accordance with Faraday's law. The AC voltage induced in the receiver coil 12 is provided through a matching network 13 to a rectifier 14 that generates an unregulated DC voltage. Rectifier 14 may be a synchronous rectifier or may be implemented using diodes. The unregulated DC voltage is regulated using a DC/DC converter 15, the output of which may be filtered and provided to a load as output voltage Vout. In some alternate embodiments, the DC/DC converter 15 can be replaced by a linear regulator or battery charger, or eliminated altogether.

As mentioned above, the inverter 3 may be a class E amplifier that converts the DC voltage at the input of inverter 3 into an AC output voltage to drive the transmit coil 10. A class E amplifier may use LC resonance to cause the voltage across a switch to become zero or approximately zero by the time the switch switches, which can achieve or approximate zero-voltage switching. However, the techniques described herein are not limited to use of a class E amplifier for inverter 3, as another suitable amplifier configuration may be used, such as another type of soft-switched power converter. The inverter 3 may be a single-ended amplifier or a differential amplifier, as the techniques described herein are not limited in this respect.

Figure 3:
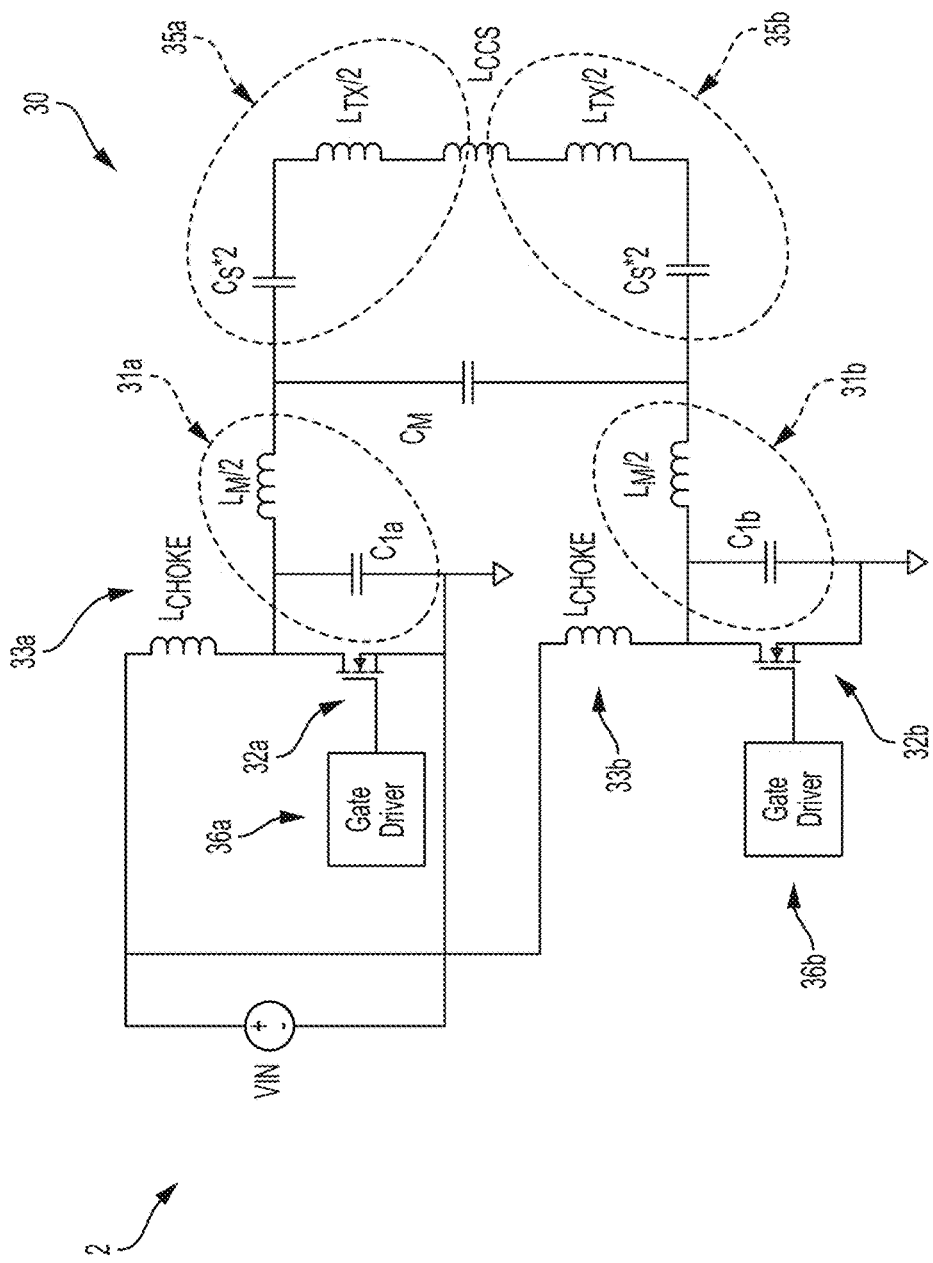
FIG. 3 shows circuit diagram of one embodiment of a class E amplifier.

FIG. 3 shows one embodiment of a Class-E amplifier 30. The amplifier 30 may include choke inductors Lchoke 33a and 33b between transistors 32a and 32b, respectively, and regulated voltage source 2. The amplifier 30 may also include gate drivers 36a and 36b for transistors 32a and 32b, respectively, a capacitor C1a and C1b parallel to transistors 32a and 32b, respectively, and ground, and a serial LC circuits 35a and 35b to the output comprising at least Cs, Ltx and Lccs. When each transistor turns on, it stores energy in its respective choke, 33a or 33b. When each transistor switches off, the choke discharges into its respective LC tank 31a or 31b. In a well-tuned class-E, when the voltage across a transistor is high, the current through it is low, and vice versa. Hence the product of voltage and current across the switch is always low, resulting in good efficiency.

As mentioned above, in some embodiments, the switching timing of the inverter 3 may be adjusted based on the load impedance seen by the wireless power transmitter 1 to improve efficiency. In some embodiments, the duty cycle of the inverter 3 is adjusted based upon the load impedance seen by the wireless power transmitter 1.

Figure 4:
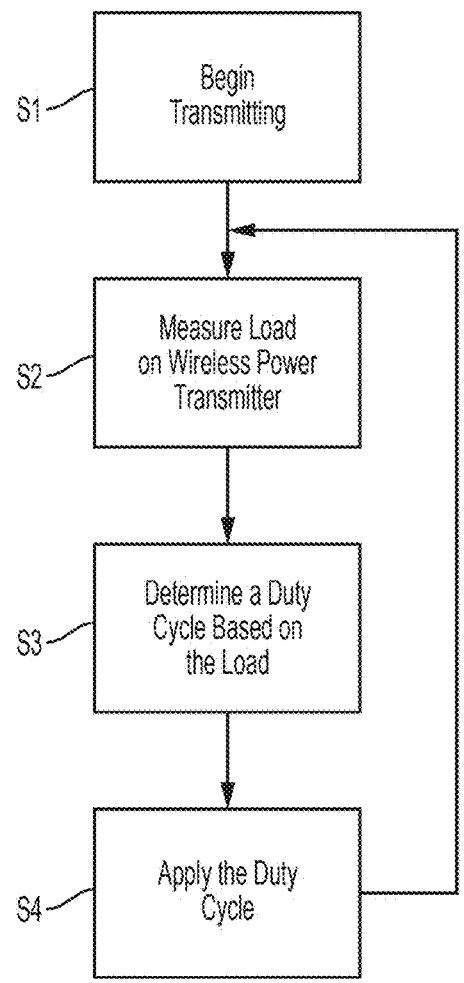
FIG. 4 shows a block diagram of a method of operating a wireless power transmitter, according to some embodiments.

FIG. 4 shows a method of operating a wireless power transmitter, according to some embodiments. The wireless power transmitter 1 begins transmitting in step S1 by switching inverter 3 at a selected duty cycle. In some embodiments, the wireless power transmitter may begin transmitting at a duty cycle known to be safe for transmission.

In step S2, characteristic indicative of a load seen by the wireless power transmitter is measured. As an example, in step S2 the load impedance Xref seen by the wireless power transmitter 1 is measured. In some embodiments, Xref may be measured by the measurement circuit 16 (FIG. 2). Measurement circuit 16 may be coupled to drive circuit 7, such as inverter 3 or matching network 6, and/or transmit coil 10. In some embodiments, measurement circuit 16 may include a voltage sensor, a current sensor, or both. Measurements made by measurement circuit 16 may be provided to controller 5 for analysis.

Xref may be determined as a difference between the coil impedance, Zcoil, and the impedance of the transmit coil 10 under no load, Zcoil0. Zcoil0 is known at design time. Such impedances have both a real component and an imaginary component. The real component is the resistive component. The imaginary component is inductive (positive) or capacitive (negative). For some embodiments, the imaginary part of Zcoil can be assumed to be greater than the real part. Thus Zcoil can be assumed to be purely imaginary for simplicity. Accordingly, the imaginary component may be approximated as the magnitude of the impedance, i.e., Zcoil~=jωL+jXref; |Zcoil|=ωL+Xref=|Zcoil0|+Xref.

With this approximation, Xref may be calculated as follows.

$$X_{ref} = |Z_{coil}| - |Z_{coil0}| = \frac{|V_{coil}|}{|I_{coil}|} - |Z_{coil0}|$$

This approximation can enable measurement of Zcoil through magnitudes of Vcoil and Icoil. The magnitudes of Vcoil and Icoil may be measured by measurement circuit 16 by a voltage sensor and a current sensor, for example. Peak or RMS detection may be used, for example. However, in some embodiments, the above approximation may not be used, and the phase may be taken into account, which may achieve a more accurate measurement. In some embodiments, Xref may be determined by calculating the voltage standing wave ratio. Measurements may be provided from the measurement circuit 16 to the controller 5, and controller 5 may perform calculations to determine the value indicative of the load seen by the wireless power transmitter.

The techniques described herein are not limited to determining the impedance seen by the wireless power transmitter 1 in step S2, as another value indicative of the load seen by the wireless power transmitter 1 may be determined, such as the reactance seen by the wireless power transmitter 1.

In step S3, a duty cycle is determined based upon the value indicative of the load seen by the wireless power transmitter. The value indicative of the load may be mapped to a suitable duty cycle to improve efficiency. In some embodiments, Zref may be used to determine a duty cycle for inverter 3. If Zref is negative, that is the coil impedance Zcoil is less than the coil impedance under no load Zcoil0, then the system is in diode conduction and the on-time needs to be increased to improve efficiency. Accordingly, a larger duty cycle may be selected. If Zref is positive, then the system is in hard switching and the on-time needs to be decreased to improve efficiency. Accordingly, a smaller duty cycle may be selected. If Zref is zero then the system is still in tune, and the on-time may not need to be adjusted.

The duty cycle may be determined in a variety of ways. For example, in some embodiments Zref may be mapped to a duty cycle using a lookup table. In some embodiments, Zref may be mapped to a duty cycle using a stored function of duty cycle vs. Zref. In some embodiments, an algorithm may be used to incrementally adjust the duty cycle toward an optimum value. Any suitable algorithm may be used, such as a hill-climbing algorithm, for example, using efficiency or another parameter as an variable to be maximized. The lookup table, function and/or algorithm may be stored in a memory of the controller 5 or another part of the wireless power transfer system. Step S3 may be performed by controller 5, in some embodiments.

In step S4, the duty cycle determined in step S3 is applied. For example, controller 5 may determine the duty cycle and control signal generator 9 to produce signals that control inverter 3 to produce a switching waveform with the duty cycle commanded by controller 5. The method may then revert to step S2.

Figure 5:
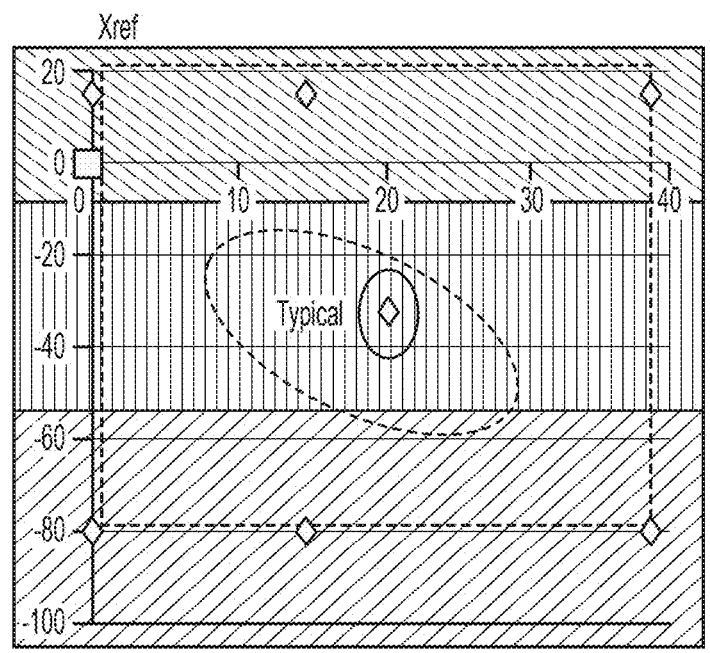
FIG. 5 shows an example of a range of impedances for Xref.

FIG. 5 shows an example of a range of impedances for Zref. The imaginary component of Zref is shown on the vertical axis and the real component is shown in the horizontal axis. Typical values of Zref are shown in the middle of the box. Accordingly, a typical inverter of a wireless power transmitter may be tuned to achieve soft-switching for values of Zref in the middle of the box. However, if Zref is in the top third of the box hard switching occurs. If Zref is in bottom third, diode conduction occurs. The techniques described herein can improve efficiency particularly for values of Zref in the upper third and bottom third of the box. The box may be divided into the following nine regions: UL (upper-left), UM (upper-middle), UR (upper-right), ML (middle-left), MM (middle-middle), MR (middle-right), LL (lower-left), LM (lower-middle) and LR (lower-right).

Figure 6:
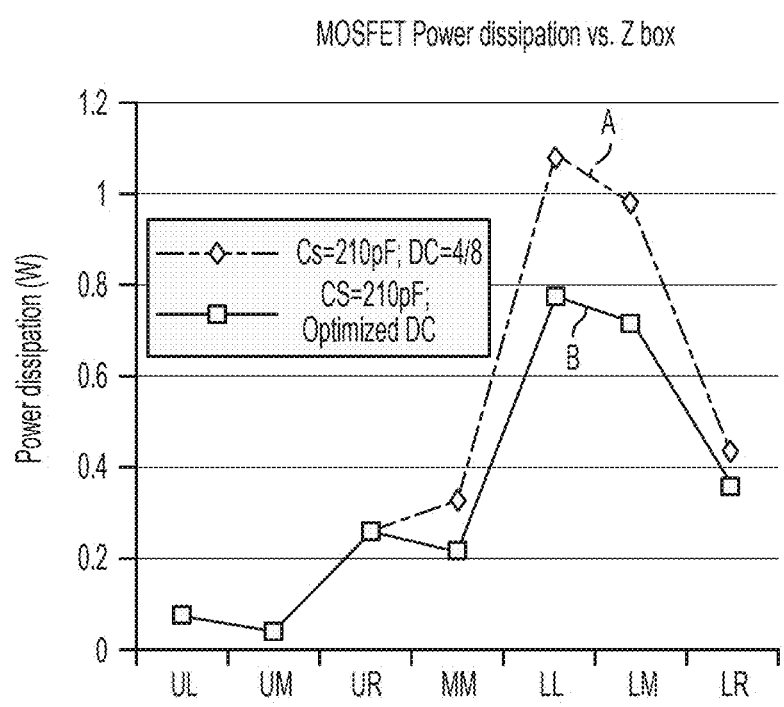
FIG. 6 shows a plot of power dissipation for different impedance conditions according to a simulated example.

FIG. 6 shows a plot of MOSFET power dissipation for different impedance conditions according to a simulated example. Going from left to right within each region represents a decrease in Xref. Line A represents a duty cycle (DC) of 4/8, while line B has a DC of 4/8 for the UL, UM, and UR regions and a DC of 5/8 for the MM, LL, LM, and LR regions. Line B shows the effect of duty cycle adjustment; by adjusting the duty cycle in the hard switching and diode conduction regions, the power dissipation fell and worst case MOSFET losses were improved by 28%. It should be appreciated this is only an example, and any suitable duty cycles may be used that are appropriate for a particular application, not limited to 4/8 and 5/8. Further, the number of different duty cycles that may be selected is not limited to two, as any suitable number of duty cycles may be selected, such as two to ten duty cycles, or greater.

As discussed above, a wireless power transmitter may be controlled using controller 5, which may be implemented by any suitable type of circuitry. For example, the controller 5 may be implemented using hardware or a combination of hardware and software. When implemented using software, suitable software code can be executed on any suitable processor (e.g., a microprocessor) or collection of processors. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, or other tangible, non-transitory computer-readable storage medium) encoded with a computer program (i.e., a plurality of executable instructions) that, when executed on one or more processors, performs the above-discussed functions of one or more embodiments. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating an inverter of a wireless power transmitter in which a voltage of the inverter varies in response to a resonant network, the method comprising:
   (A) measuring a characteristic indicative of a load seen by the wireless power transmitter;
   (B) determining a duty cycle of the inverter based upon the characteristic; and
   (C) switching the inverter with the determined duty cycle, wherein the characteristic indicative of the load is an impedance, and
   wherein (B) comprises increasing the duty cycle when an imaginary component of the impedance decreases.

2. The method of claim 1, wherein the inverter is a class E amplifier.

3. The method of claim 1, wherein the characteristic indicative of the load is estimated based upon a magnitude of a signal measured by the wireless power transmitter.

4. The method of claim 3, wherein the characteristic indicative of the load is estimated based upon a measured magnitude of a voltage and a measured magnitude of a current.

5. A method of operating an inverter of a wireless power transmitter in which a voltage of the inverter varies in response to a resonant network, the method comprising:
   (A) measuring a characteristic indicative of a load seen by the wireless power transmitter;
   (B) determining a duty cycle of the inverter based upon the characteristic; and
   (C) switching the inverter with the determined duty cycle, wherein the characteristic indicative of the load is an impedance, and
   wherein (B) comprises decreasing the duty cycle when an imaginary component of the impedance increases.

6. A wireless power transmitter, comprising:
   an inverter in which a voltage varies in response to a resonant network; and
   circuitry configured to
   (A) measure a characteristic indicative of a load seen by the wireless power transmitter;
   (B) determine a duty cycle of the inverter based upon the characteristic; and
   (C) switch the inverter with the determined duty cycle, wherein the characteristic indicative of the load is an impedance,
   wherein the characteristic indicative of the load is estimated based upon a magnitude of a signal measured by the wireless power transmitter, and
   wherein (B) comprises increasing the duty cycle when an imaginary component of the impedance decreases.

7. The wireless power transmitter of claim 6, wherein the inverter is a class E amplifier.

8. The wireless power transmitter of claim 6, wherein the characteristic indicative of the load is estimated based upon a measured magnitude of a voltage and a measured magnitude of a current.

9. The wireless power transmitter of claim 6, wherein the circuitry comprises a measurement circuit configured to perform at least a portion of (A), and a controller configured to perform at least a portion of (B).

10. A wireless power transmitter, comprising:
    an inverter in which a voltage varies in response to a resonant network; and
    circuitry configured to
    (A) measure a characteristic indicative of a load seen by the wireless power transmitter;
    (B) determine a duty cycle of the inverter based upon the characteristic; and
    (C) switch the inverter with the determined duty cycle, wherein the characteristic indicative of the load is an impedance,
    wherein the characteristic indicative of the load is estimated based upon a magnitude of a signal measured by the wireless power transmitter, and
    wherein (B) comprises decreasing the duty cycle when an imaginary component of the impedance increases.

11. A non-transitory computer readable storage medium having stored thereon instructions, which, when executed by a processor, perform a method of operating an inverter of a wireless power transmitter in which a voltage of the inverter varies in response to a resonant network, the method comprising:
- (A) measuring a characteristic indicative of a load seen by the wireless power transmitter;
- (B) determining a duty cycle of the inverter based upon the characteristic; and
- (C) switching the inverter with the determined duty cycle, wherein the characteristic indicative of the load is an impedance, and
- wherein (B) comprises increasing the duty cycle when an imaginary component of the impedance decreases, and (B) comprises decreasing the duty cycle when an imaginary component of the impedance increases.

12. The non-transitory computer readable storage medium of claim 11, wherein the characteristic indicative of the load is estimated based upon a magnitude of a signal measured by the wireless power transmitter.

13. The non-transitory computer readable storage medium of claim 12, wherein the characteristic indicative of the load is estimated based upon a measured magnitude of a voltage and a measured magnitude of a current.

* * * * *